United States Patent
Lin

(10) Patent No.: US 11,382,226 B2
(45) Date of Patent: Jul. 5, 2022

(54) ELECTRONIC DEVICE AND HOUSING STRUCTURE AND LOCKING MODULE THEREOF

(71) Applicant: Wistron Corp., New Taipei (TW)

(72) Inventor: Chih Shen Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 189 days.

(21) Appl. No.: 16/844,961

(22) Filed: Apr. 9, 2020

(65) Prior Publication Data

US 2021/0120686 A1    Apr. 22, 2021

(30) Foreign Application Priority Data

Oct. 16, 2019    (TW) .................................. 108137168

(51) Int. Cl.
*H05K 5/00*    (2006.01)
*H05K 5/02*    (2006.01)
(Continued)

(52) U.S. Cl.
CPC ............. *H05K 5/0221* (2013.01); *H05K 5/03* (2013.01); *H05K 7/16* (2013.01)

(58) Field of Classification Search
CPC ...... H05K 5/0221; H05K 5/03; H05K 5/0239; H05K 5/0013; H05K 5/023; H05K 5/0204; H05K 7/16; H05K 7/1487; H05K 7/1488; G06F 1/181; G06F 1/1601; G06F 1/18; G06F 1/187; B65D 43/20; B65D 43/12; E05C 19/06; E05C 19/006; E05C 1/04; E05C 1/10; Y10T 292/0894; Y10T 292/0902; Y10T 292/0905; Y10T 292/42; Y10T 292/438; Y10T 292/444; Y10T 292/11
(Continued)

(56) References Cited

U.S. PATENT DOCUMENTS 7,193,855 B2 *  3/2007  Fan .................. G06F 1/183
                                                    312/223.2
9,201,473 B2 * 12/2015  Li .................... G06F 1/187
(Continued)

FOREIGN PATENT DOCUMENTS

CN    101728500    *  6/2010
CN    109041491    * 12/2018
(Continued)

*Primary Examiner* — Janet M Wilkens

(57) ABSTRACT

An electronic device is provided. The electronic device includes a case, a mainboard, a cover and a locking module. The mainboard is disposed in the case. The cover covers the case. The locking module is disposed on the cover. The locking module includes a base, a latch, and a rotational member. The base is affixed to the cover. The latch is connected to the base, wherein the latch is moved between the first latch position and the second latch position relative to the base. The latch includes a recess and a protrusion. The rotational member is connected to the base. The rotational member is moved between the first rotational member position and the second rotational member position relative to the base. The rotational member includes a end portion, and the end portion is detachably connected to the recess. The locking module provides an automatic locking function.

17 Claims, 9 Drawing Sheets

(51) Int. Cl.
*H05K 7/16* (2006.01)
*H05K 5/03* (2006.01)

(58) Field of Classification Search
USPC .................. 312/223.1, 223.2, 265.5, 265.6;
220/345.1, 245.5, 351, 345.4; 174/50;
49/463; 361/379.33, 679.37, 679.58, 726,
361/727
See application file for complete search history.

(56) References Cited

U.S. PATENT DOCUMENTS

| | | | | |
|---|---|---|---|---|
| 9,575,518 B2* | 2/2017 | Geng | ....................... | G06F 1/182 |
| 10,624,223 B1* | 4/2020 | Tsorng | ............... | H05K 7/20172 |
| 2005/0013105 A1* | 1/2005 | Lin | ........................ | G06F 1/181 |
| | | | | 361/679.58 |
| 2005/0104486 A1* | 5/2005 | Huang | ................. | H05K 5/0013 |
| | | | | 312/223.2 |
| 2007/0217137 A1* | 9/2007 | Chen | ....................... | G06F 1/181 |
| | | | | 361/807 |
| 2007/0222327 A1* | 9/2007 | Li | ........................... | H02K 11/40 |
| | | | | 310/239 |
| 2007/0247035 A1* | 10/2007 | Chen | ....................... | A47B 47/02 |
| | | | | 312/223.2 |
| 2013/0153287 A1* | 6/2013 | Hsieh | ....................... | G06F 1/187 |
| | | | | 174/378 |
| 2017/0150634 A1* | 5/2017 | Huang | ................... | H05K 5/023 |
| 2020/0037457 A1* | 1/2020 | Chen | ................... | H05K 7/1487 |
| 2020/0375057 A1* | 11/2020 | Chang | .................. | H05K 7/1487 |
| 2021/0204420 A1* | 7/2021 | Chen | ................... | H05K 7/1487 |

FOREIGN PATENT DOCUMENTS

| | | | |
|---|---|---|---|
| JP | H 08-303087 A | | 11/1996 |
| JP | H08326385 | * | 12/1996 |

* cited by examiner

ELECTRONIC DEVICE AND HOUSING STRUCTURE AND LOCKING MODULE THEREOF

CROSS REFERENCE TO RELATED APPLICATIONS

This application claims priority of Taiwan Patent Application No. 108137168, filed on Oct. 16, 2019, the entirety of which is incorporated by reference herein.

BACKGROUND OF THE INVENTION

Field of the Invention

The present invention relates to a locking module, and in particular to a locking module with an automatic locking function.

Description of the Related Art

The conventional housing structure of the electronic device includes a case and a cover. The cover is connected to the case by screws or latches. However, conventionally, the user must affix the cover to the case manually. For example, the user must rotate the screws the affix the cover to the case. Or, the latch is pushed by the user to connect the cover to the case. It is inconvenience to the user since the cover must be affixed to the case manually.

BRIEF SUMMARY OF THE INVENTION

In one embodiment, an electronic device is provided. The electronic device includes a case, a mainboard, a cover and a locking module. The mainboard is disposed in the case. The cover covers the case. The locking module is disposed on the cover. The locking module comprises a base, a latch and a rotational member. The base is affixed to the cover. The latch is connected to the base, wherein the latch is moved between the first position and the second latch position relative to the base, and the latch comprises a recess and a protrusion. The rotational member is connected to the base, wherein the rotational member is moved between the first rotational member position and the second rotational member position relative to the base, the rotational member comprises a end portion, and the end portion is detachably connected to the recess. In a wedged state, the latch is in the second latch position, the rotational member is in the second rotational member position, the end portion is separated from the recess, and the protrusion is wedged into the case.

In one embodiment, the locking module further comprises a first elastic element, the first elastic element applies a first elastic force to the rotational member, and the rotational member tends to return to the first rotational member position due to the first elastic force.

In one embodiment, the locking module further comprises a second elastic element, the second elastic element applies a second elastic force to the latch, and the latch tends to return to the second latch position due to the second elastic force.

In one embodiment, the rotational member comprises a member abutting portion, the member abutting portion is located between the protrusion and the cover in the first direction, and when the member abutting portion is pushed, the rotational member is rotated from the first rotational member position to the second rotational member position, and the latch is thereby moved from the first latch position to the second latch position.

In one embodiment, the rotational member comprises a member body and a pivot portion, the end portion is located on the first end of the member body, the member abutting portion is located on the second end of the member body, and the pivot portion is connected to the member body and pivots on the base.

In one embodiment, the locking module further comprises a first elastic element, rotational member further comprises a member post, the member post is connected to the member body, the member post is disposed on the first end, the first elastic element is telescoped on the member post, one end of the first elastic element abuts the member body, the other end of the first elastic element abuts the base, the base comprises a first base groove, and the member post is inserted into the first base groove and is adapted to slide in the first base groove.

In one embodiment, the locking module further comprises a second elastic element, the latch further comprises a latch body and a latch post, the latch post is connected to the latch body, the second elastic element is telescoped on the latch post, one end of the second elastic element abuts the latch body, the other end of the second elastic element abuts the base, the base comprises a second base groove, the latch post is inserted into the second base groove and is adapted to slide in the second base groove.

In one embodiment, the latch further comprises an extending portion, the extending portion is connected to the latch body, the protrusion is formed on the extending portion, a latch opening is formed on the extending portion, and the member abutting portion passes through the latch opening.

In one embodiment, the latch body comprises a first body surface, the latch further comprises a pushing portion, the pushing portion is formed on the first body surface, the cover comprises a cover opening, and the cover opening corresponds to the pushing portion.

In one embodiment, the latch body further comprises a second body surface, the second body surface is opposite the first body surface, the base comprises a plurality of slidable bumps, and the slidable bumps abut the second body surface.

In one embodiment, the case comprises a case wedging hole, in the wedged state, the latch is in the second latch position, the rotational member is in the second member position, the end portion is separated from the recess, and the protrusion is wedged into the case wedging hole.

In one embodiment, the case comprises a case abutting portion, and the case abutting portion pushes the member abutting portion to rotate the rotational member from the first rotational member position to the second rotational member position, and to move the latch from the first latch position to the second latch position.

In another embodiment, a housing structure is provided. The housing structure comprises a case, a cover and a locking module. The cover covers the case. The locking module is disposed on the cover. The locking module comprises a base, a latch and a rotational member. The base is affixed to the cover. The latch is connected to the base, wherein the latch is moved between the first latch position and the second latch position relative to the base, and the latch comprises a recess and a protrusion. The rotational member is connected to the base, wherein the rotational member is moved between the first rotational member position and the second rotational member position relative to the base, the rotational member comprises a end portion, and the end portion is detachably connected to the recess. In a wedged state, the latch is in the second latch position, the rotational member is in the second rotational member position, the end portion is separated from the recess, and the protrusion is wedged into the case.

In another embodiment, a locking module is provided. The locking module includes a base, a latch and a rotational member. The latch is connected to the base, wherein the latch is moved between the first latch position and the second latch position relative to the base, and the latch comprises a recess and a protrusion. The rotational member is connected to the base, wherein the rotational member is moved between the first rotational member position and the second rotational member position relative to the base, the rotational member comprises an end portion, and the end portion is detachably to the recess. In a wedged state, the latch is in the second latch position, the rotational member is in the second rotational member position, the end portion is separated from the recess, and the protrusion is wedged into the case.

In one embodiment, the latch body comprises a first body surface, the latch further comprises a pushing portion and a plurality of sliding ribs, the pushing portion is formed on the first body surface, and the sliding ribs are formed on the first body surface.

Utilizing the electronic device, the housing structure or the locking module of the embodiment of the invention, when the cover is combined with the case, the case abutting portion pushes the member abutting of the movable member, the movable member is rotated from the first rotational member position to the second rotational member position, the latch is moved from the first latch position to the second latch position to lock the case automatically. The locking module of the embodiment of the invention increases the convenience of the user.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
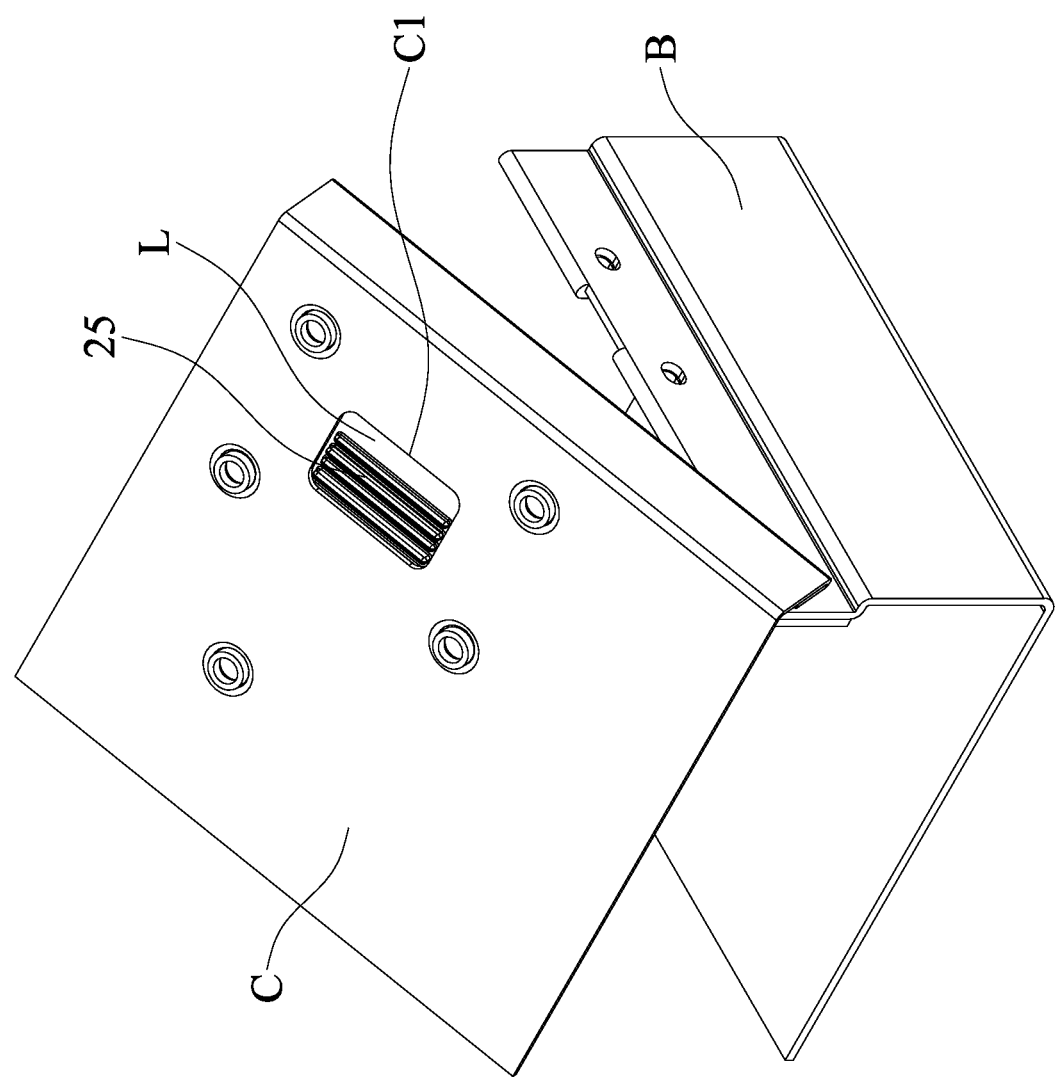
FIG. 1A shows an electronic device of the embodiment of the invention.
Figure 1B:
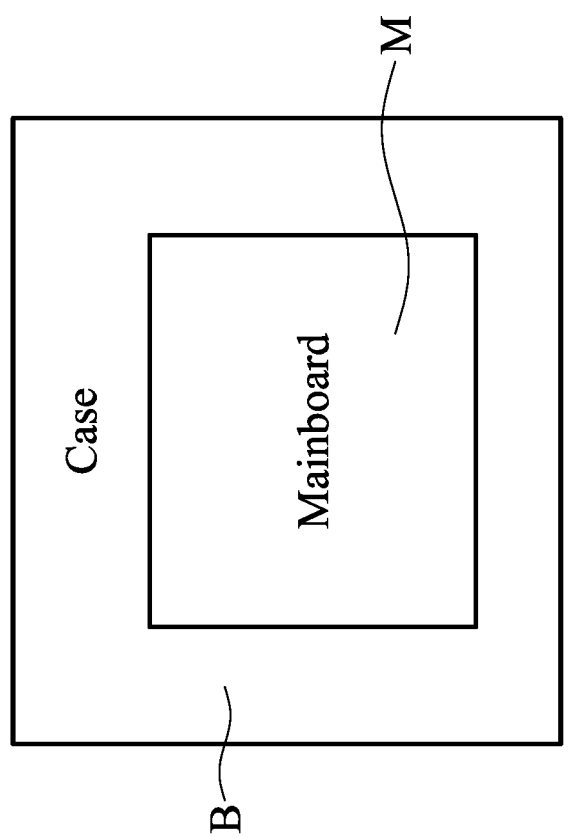
FIG. 1B is a block diagram of a portion of the electronic device of the embodiment of the invention.

FIG. 1A shows an electronic device of the embodiment of the invention. FIG. 1B is a block diagram of a portion of the electronic device of the embodiment of the invention. With reference to FIGS. 1A and 1B, the electronic device S of the embodiment of the invention includes a case B, a mainboard M, a cover C and a locking module L. The mainboard M is disposed in the case B. The cover C covers the case B. The locking module L is disposed on the cover C.

The electronic device can be server or other electronic devices.

Figure 2:
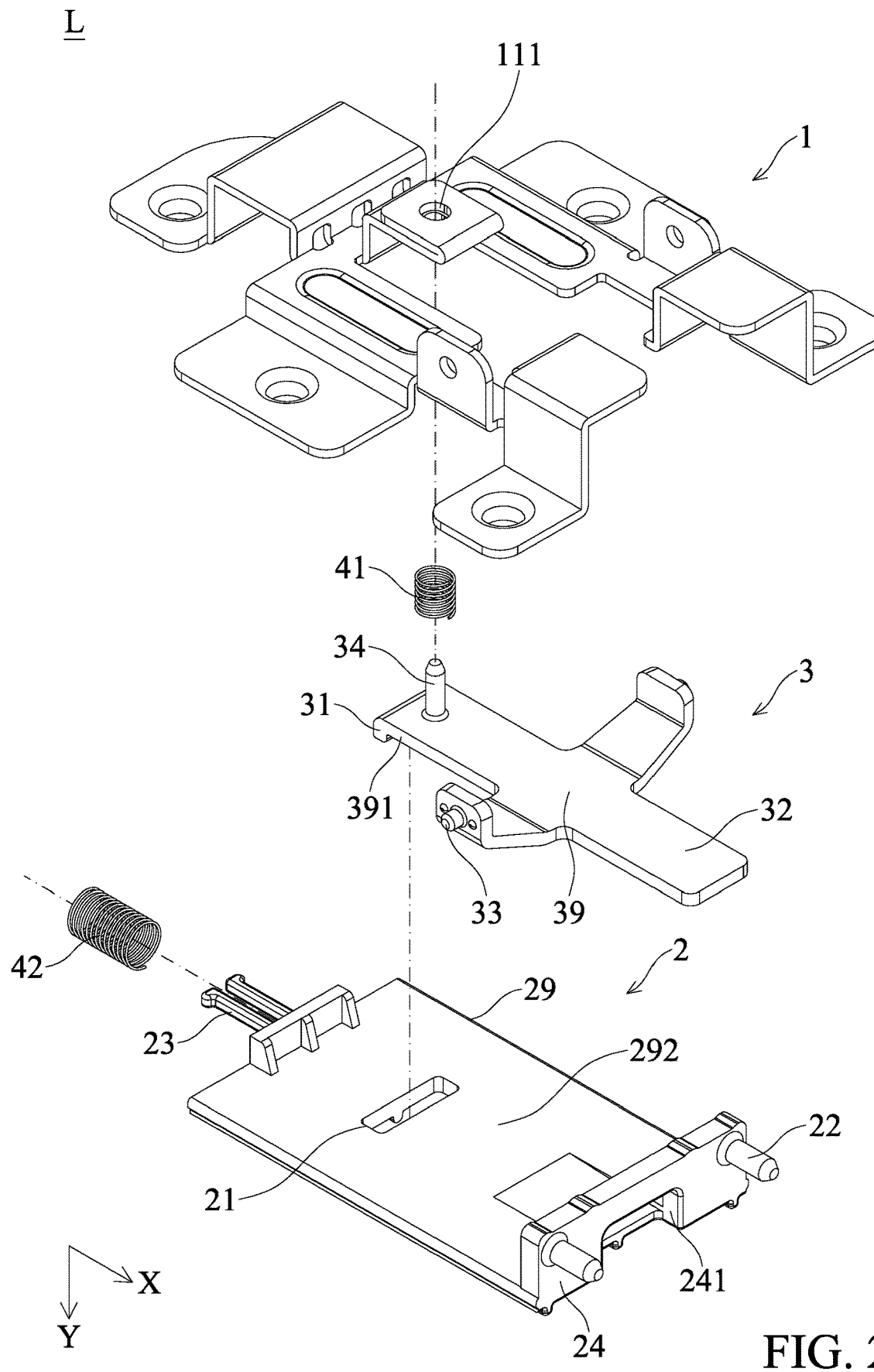
FIG. 2 is an exploded view of the locking module of the embodiment of the invention.
Figure 3A:
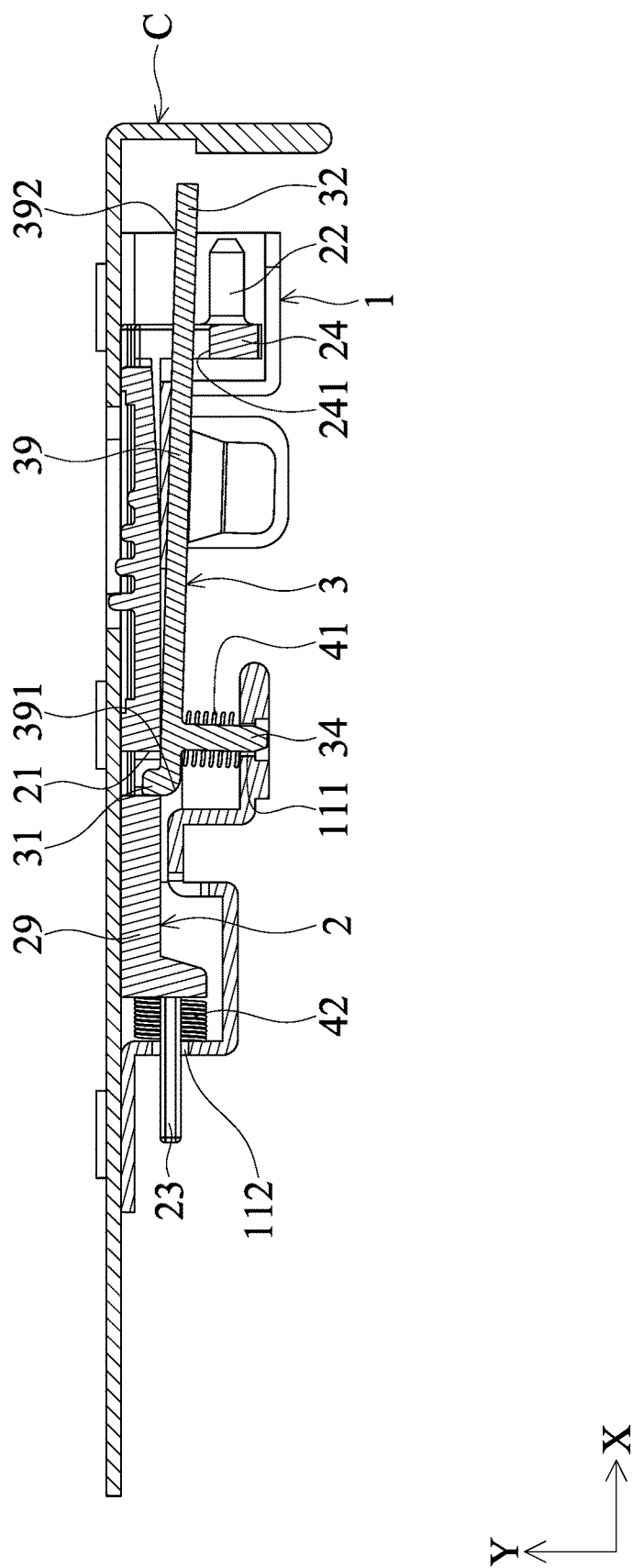
FIGS. 3A and 3B show the movement of the locking module of the embodiment of the invention.
Figure 3B:
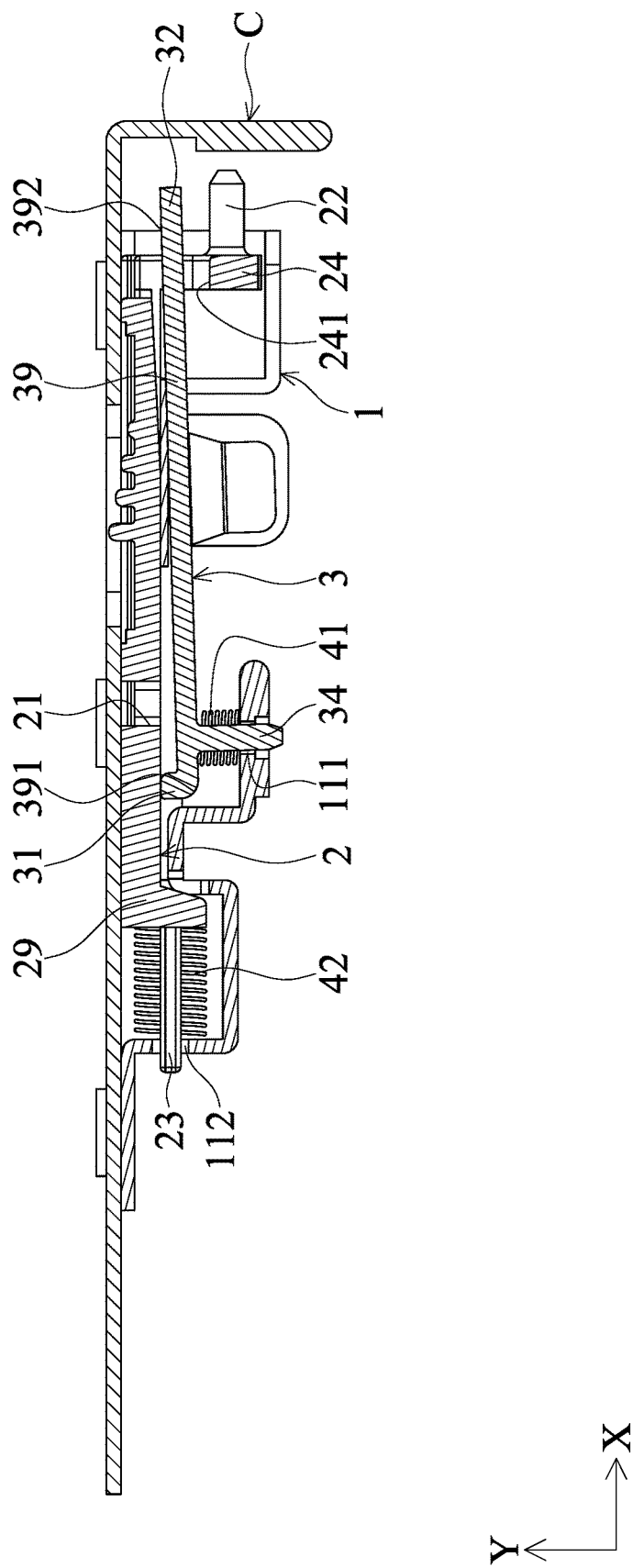

FIG. 2 is an exploded view of the locking module of the embodiment of the invention. FIGS. 3A and 3B show the movement of the locking module of the embodiment of the invention. With reference to FIGS. 2, 3A and 3B, the locking module L comprises a base 1, a latch 2 and a rotational member 3. The base 1 is affixed to the cover. The latch 2 is connected to the base 1. The latch 2 is moved between the first latch position (FIG. 3A) and the second latch position (FIG. 3B) relative to the base 1. The latch 2 comprises a recess 21 and a protrusion 22. The rotational member 3 is connected to the base 1. The rotational member 3 is moved between the first rotational member position (FIG. 3A) and the second member position (FIG. 3B) relative to the base 1. The rotational member 3 comprises an end portion 31. The end portion 31 is detachably connected to the recess 21. In a non-wedged state (FIG. 3A), the latch 2 is in the first latch position, the rotational member 3 is in the first rotational member position, the end portion 31 wedges the recess 21 and the protrusion 22 is separated from the case B.

With reference to FIGS. 2, 3A and 3B, in one embodiment, in a wedged state (FIG. 3B), the latch 2 is in the second latch position, the rotational member 3 is in the second rotational member position, the end portion 31 is separated from the recess 21, and the protrusion 22 is wedged into the case B. Therefore, the cover C is prevented from being separated from the case B.

Figure 4A:
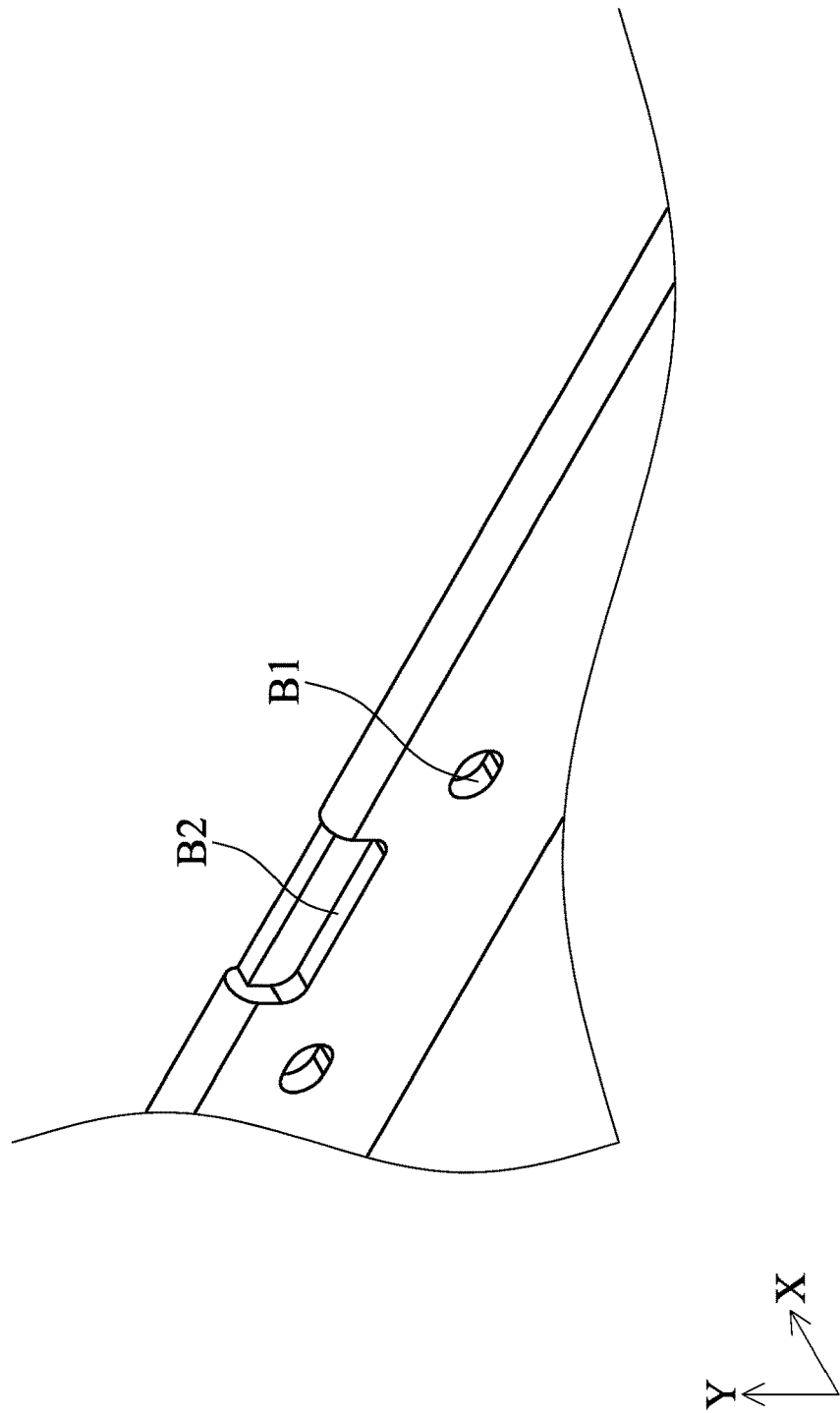
FIG. 4A shows the details of the case of the embodiment of the invention.
Figure 4B:
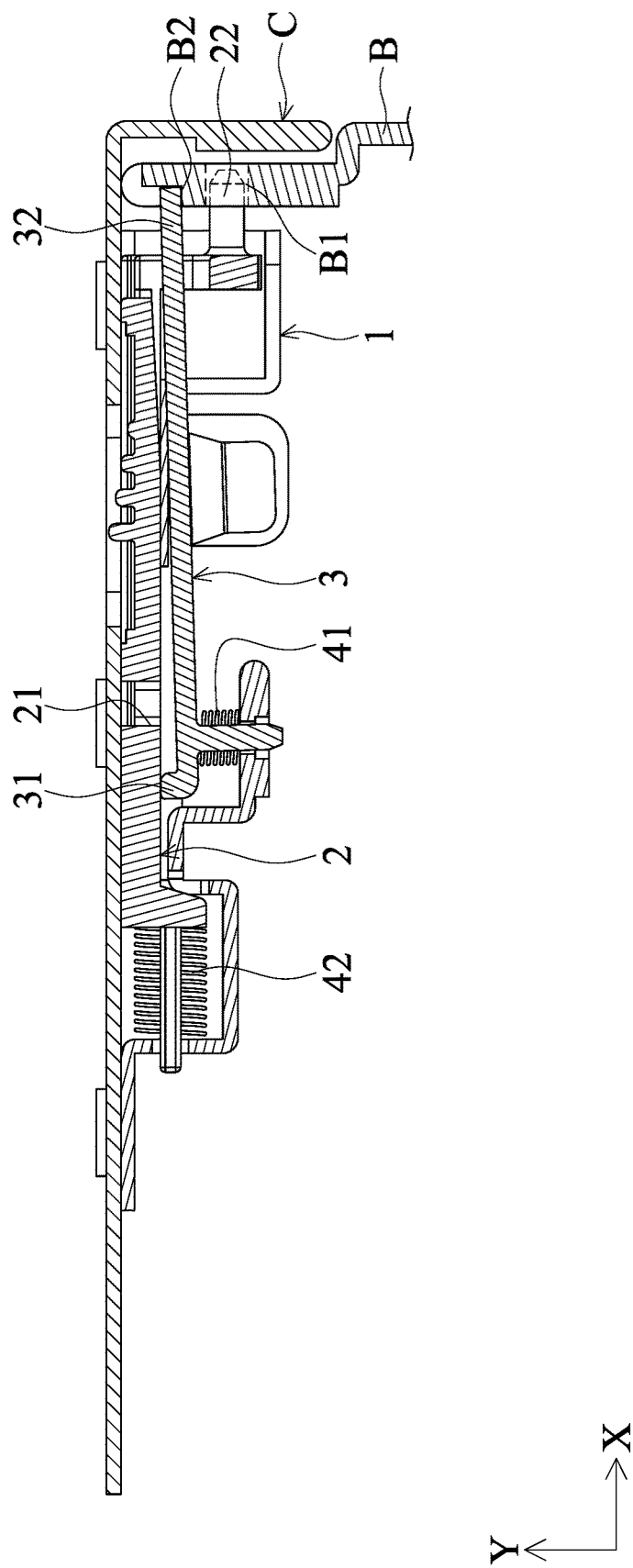
FIG. 4B shows the protrusion of the embodiment of the invention which is wedged into the case.

FIG. 4A shows the details of the case of the embodiment of the invention. FIG. 4B shows the protrusion of the embodiment of the invention. With reference to FIGS. 4A and 4B, in one embodiment, the case B comprises a case wedging hole B1. In the wedged state, the latch 2 is in the second latch position, the rotational member 3 is in the second rotational member position, the end portion 31 is separated from the recess 21, and the protrusion 22 is wedged into the case wedging hole B1. Therefore, the cover C is prevented from being separated from the case B.

With reference to FIGS. 4A and 4B, in one embodiment, the case B comprises a case abutting portion B2. The case abutting portion B2 pushes a member abutting portion 32 of the rotational member 3 to rotate the rotational member 3 from the first rotational member position to the second rotational member position, and to move the latch 2 from the first latch position to the second latch position.

With reference to FIGS. 2, 3A and 3B, in one embodiment, the locking module L further comprises a first elastic element 41. The first elastic element 41 applies a first electric force to the rotational member 3. The rotational member 3 tends to return to the rotational member position due to the first elastic force.

In the embodiment of the invention, the first elastic element 41 can be compressed spring. The first elastic element can also be elastic sheet or other elastic elements. The disclosure is not meant to restrict the invention.

In another embodiment, the first elastic element can be omitted, and the weight of the member abutting portion can be increased. By increasing the weight of the member abutting portion, the rotational member 3 tends to return to the first rotational member position. The disclosure is not meant to restrict the invention.

With reference to FIGS. 2, 3A and 3B, in one embodiment, the locking module L further comprises a second elastic element 42. The second elastic element 42 applies a second elastic force to the latch 2, and the latch 2 tends to return to the second latch position due to the second elastic force.

In the embodiment of the invention, the second elastic element 42 can be compressed spring. The second elastic element can also be elastic sheet or other elastic elements. The disclosure is not meant to restrict the invention.

With reference to FIGS. 3A, 3B and 4B, in one embodiment, the rotational member 3 comprises the member abutting portion 32. The member abutting portion 32 is located between the protrusion 22 and the cover C in the first direction Y. When the member abutting portion 32 is pushed, the rotational member 3 is rotated from the first rotational member position to the second rotational member position. The end portion 31 is separated from the recess 21 to release the latch 2. Via the second elastic force applied by the second elastic element 42 to the latch 2, the latch 2 is moved form the first latch position to the second latch position.

With reference to FIGS. 2, 3A and 3B, in one embodiment, the rotational member 3 comprises a member body 39 and a pivot portion 33. The end portion 31 is on a first end 391 of the member body 39. The member abutting portion 32 is located on a second end 392 of the member body 39. The pivot portion 33 is connected to the member body 39 and pivots on the base 1.

With reference to FIGS. 2, 3A and 3B, in one embodiment, the rotational member 3 further comprises a member post 34. The member post 34 is connected to the member body 39. The member post 34 is disposed on the first end 391. The first elastic element 41 is telescoped on the member post 34. One end of the first elastic element 41 abuts the member body 39. The other end of the first elastic element 41 abuts the base 1. The base 1 comprises a first base groove 111. The member post 34 is inserted into the first base groove 111 and is adapted to slide in the first base groove 111. Therefore, the member post 34 can stably slide in the first direction Y.

With reference to FIGS. 2, 3A and 3B, in one embodiment, the latch 2 further comprises a latch body 29 and a latch post 23. The latch post 23 is connected to the latch body 29. The second elastic element 42 is telescoped on the latch post 23. One end of the second elastic element 42 abuts the latch body 29. The other end of the second elastic element 42 abuts the base 1. The base 1 comprises a second base groove 112. The latch post 23 is inserted into the second base groove 112 and is adapted to slide in the second base groove 112. Therefore, the latch post 23 can stably slide in a second direction X. In one embodiment, the first direction Y is perpendicular to the second direction X.

With reference to FIGS. 2, 3A and 3B, in one embodiment, the latch 2 further comprises an extending portion 24. The extending portion 24 is connected to the latch body 29. The protrusion 22 is formed on the extending portion 24. A latch opening 241 is formed on the extending portion 24. The member abutting portion 32 passes through the latch opening 241.

According to the design of the member abutting portion 32 passing through the opening 241, the member abutting portion 32 is located between the protrusion 22 and the cover C. With reference to FIG. 4B, when the cover C is combined with the case B, the case abutting portion B2 pushes the member abutting portion 32 of the movable member 3, the movable member 3 is thus rotated from the first rotational member position to the second rotational member position, and the latch 2 is moved from the first latch position to the second latch position to lock the case C. Since the member abutting member 32 is above the protrusion 22, the protrusion 22 must be corresponding to the inner wall of the case B as the member abutting portion 32 being pressed. The cover C therefore can be combined with the case B smoothly.

Figure 5:
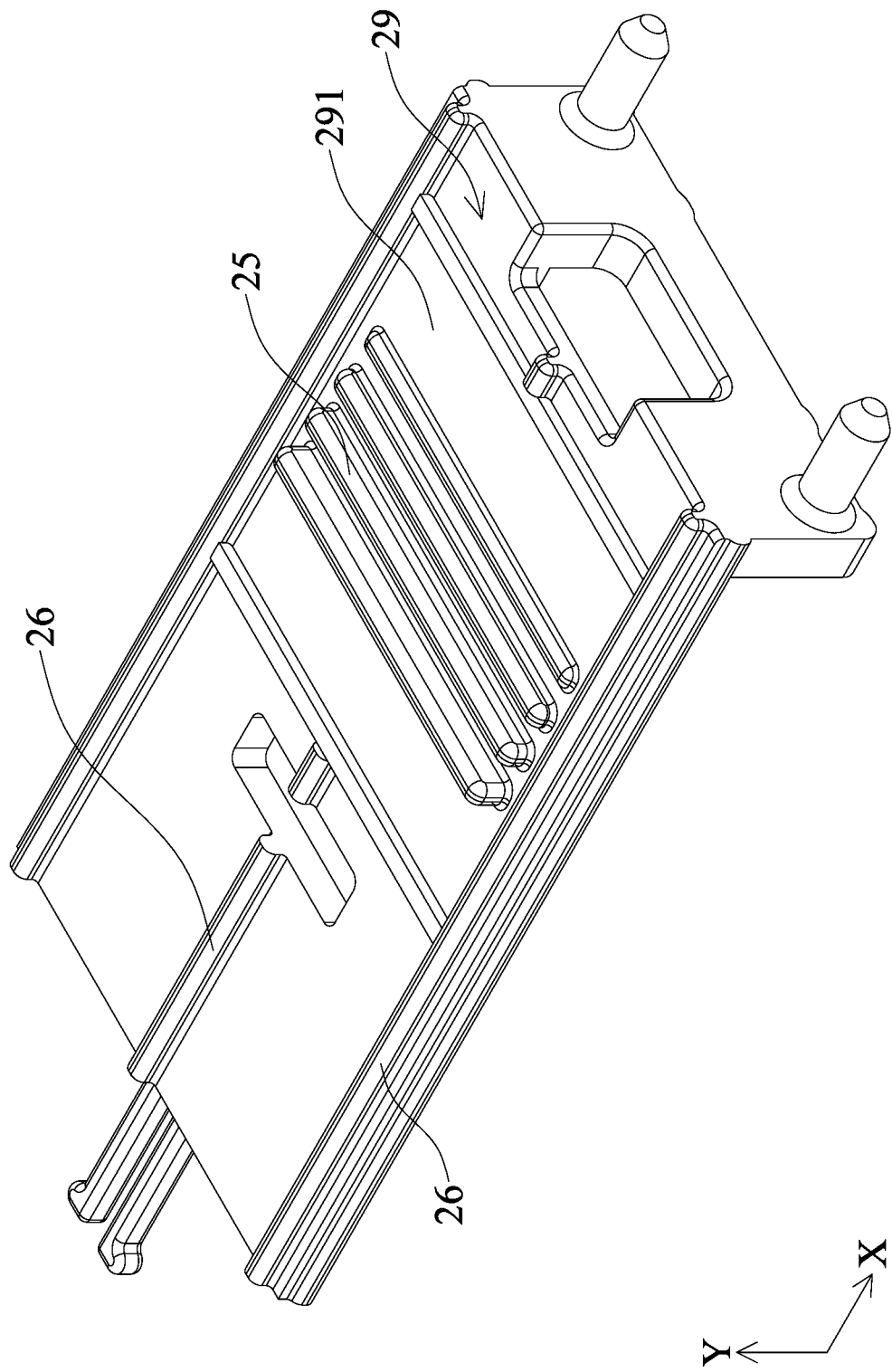
FIG. 5 shows the details of the latch of the embodiment of the invention.

FIG. 5 shows the details of the latch of the embodiment of the invention. With reference to FIG. 5, in one embodiment, the latch body 29 comprises a first body surface 291. The latch 2 further comprises a pushing portion 25. The pushing portion 25 is formed on the first body surface 291. With reference to FIG. 1A, the cover C comprises a cover opening C1, and the cover opening C1 corresponds to the pushing portion 25.

With reference to FIG. 5, in one embodiment, the latch 2 further comprises a plurality of sliding ribs 26. The sliding ribs 26 are formed on the first body surface 291. The sliding ribs 26 decrease the fraction force between the latch 2 and the cover C, and the latch 2 can therefore smoothly slide.

Figure 6:
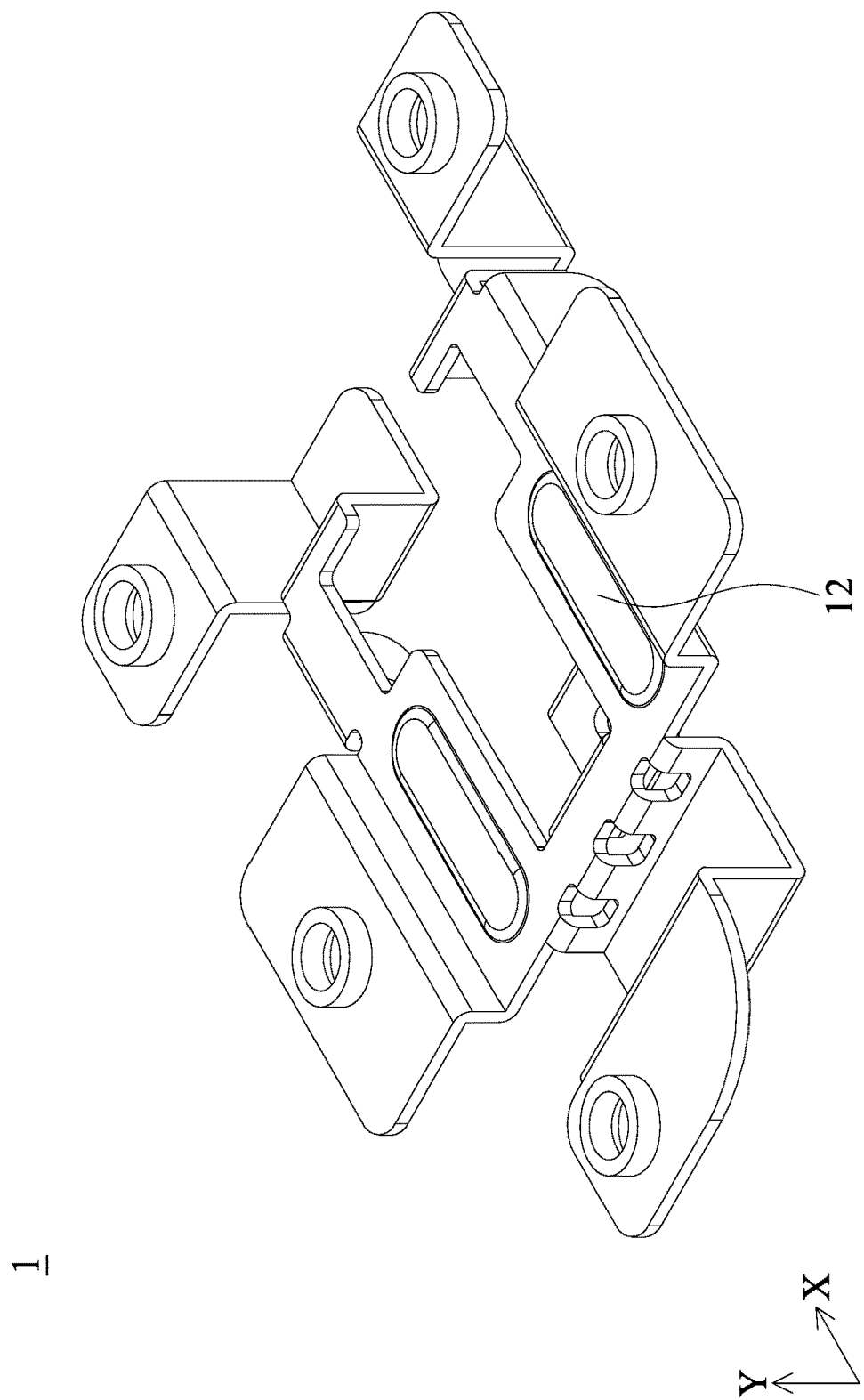
FIG. 6 shows the details of the base of the embodiment of the invention.

With reference to FIG. 1A, in one embodiment, the latch body 29 further comprises a second body surface 292. The second body surface 292 is opposite the first body surface 291. FIG. 6 shows the details of the base of the embodiment of the invention. With reference to FIGS. 1A and 6, the base 1 comprises a plurality of slidable bumps 12, and the slidable bumps 12 abut the second body surface 292. The slidable bumps 12 decrease the fraction force between the latch 2 and the base 1, and the latch 2 can therefore smoothly slide.

In another embodiment, a housing structure is provided. The housing structure comprises the case, the cover and the locking module. The housing structure can be utilized in computer host, storage device or other electronic device. The disclosure is not meant to restrict the invention.

In another embodiment, a locking module is provided. The locking module includes the base, the latch and the rotational member. The locking module can be utilized in other receiving structure. The disclosure is not meant to restrict the invention.

Utilizing the electronic device, the housing structure or the locking module of the embodiment of the invention, when the cover is combined with the case, the case abutting portion pushes the member abutting of the movable member, the movable member is rotated from the first rotational member position to the second rotational member position, the latch is moved from the first latch position to the second latch position to lock the case automatically. The locking module of the embodiment of the invention increases the convenience of the user.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass such modifications and similar arrangements.

What is claimed is:

1. An electronic device, comprising:
   a case;
   a mainboard, disposed in the case;
   a cover, covering the case; and
   a locking module, disposed on the cover, comprising:
   a base, affixed to the cover;
   a latch, connected to the base, wherein the latch is moved between a first latch position and a second latch position relative to the base, and the latch comprises a recess and a protrusion; and
   a rotational member, connected to the base, wherein the rotational member is moved between a first rotational member position and a second rotational member position relative to the base, the rotational member comprises an end portion, and the end portion is detachably connected to the recess,
   wherein in a wedged state, the latch is in the second latch position, the rotational member is in the second rotational member position, the end portion is separated from the recess, and the protrusion is wedged into the case,
   wherein the rotational member comprises a member abutting portion, the member abutting portion is located between the protrusion and the cover in a first direction, and when the member abutting portion is pushed, the rotational member is rotated from the first rotational member position to the second rotational member position, and the latch is thereby moved from the first latch position to the second latch position.

2. The electronic device as claimed in claim 1, wherein the locking module further comprises a first elastic element, the first elastic element applies a first elastic force to the rotational member, and the rotational member tends to return to the first rotational member position due to the first elastic force.

3. The electronic device as claimed in claim 1, wherein the locking module further comprises a second elastic element, the second elastic element applies a second elastic force to the latch, and the latch tends to return to the second latch position due to the second elastic force.

4. The electronic device as claimed in claim 1, wherein the rotational member comprises a member body and a pivot portion, the end portion is located on a first end of the member body, the member abutting portion is located on a second end of the member body, and the pivot portion is connected to the member body and pivots on the base.

5. The electronic device as claimed in claim 4, wherein the locking module further comprises a first elastic element, the rotational member further comprises a member post, the member post is connected to the member body, the member post is disposed on the first end, the first elastic element is telescoped on the member post, one end of the first elastic element abuts the member body, the other end of the first elastic element abuts the base, the base comprises a first base groove, and the member post is inserted into the first base groove and is adapted to slide in the first base groove.

6. The electronic device as claimed in claim 5, wherein the locking module further comprises a second elastic element, the latch further comprises a latch body and a latch post, the latch post is connected to the latch body, the second elastic element is telescoped on the latch post, one end of the second elastic element abuts the latch body, the other end of the second elastic element abuts the base, the base comprises a second base groove, the latch post is inserted into the second base groove and is adapted to slide in the second base groove.

7. The electronic device as claimed in claim 6, wherein the latch further comprises an extending portion, the extending portion is connected to the latch body, the protrusion is formed on the extending portion, a latch opening is formed on the extending portion, and the member abutting portion passes through the latch opening.

8. The electronic device as claimed in claim 7, wherein the latch body comprises a first body surface, the latch further comprises a pushing portion, the pushing portion is formed on the first body surface, the cover comprises a cover opening, and the cover opening corresponds to the pushing portion.

9. The electronic device as claimed in claim 8, wherein the latch body further comprises a second body surface, the second body surface is opposite the first body surface, the base comprises a plurality of slidable bumps, and the slidable bumps abut the second body surface.

10. The electronic device as claimed in claim 9, wherein the case comprises a case wedging hole, in the wedged state, the latch is in the second latch position, the rotational member is in the second rotational member position, the end portion is separated from the recess, and the protrusion is wedged into the case wedging hole.

11. The electronic device as claimed in claim 10, wherein the case comprises a case abutting portion, and the case abutting portion pushes the member abutting portion to rotate the rotational member from the first rotational member position to the second rotational member position, and to move the latch from the first latch position to the second latch position.

12. A housing structure, comprising:
    a case;
    a cover, covering the case; and
    a locking module, disposed on the cover, comprising:
    a base, affixed to the cover;
    a latch, connected to the base, wherein the latch is moved between a first latch position and a second latch position relative to the base, and the latch comprises a recess and a protrusion; and
    a rotational member, connected to the base, wherein the rotational member is moved between a first rotational member position and a second rotational member position relative to the base, the rotational member comprises an end portion, and the end portion is detachably connected to the recess,
    wherein in a wedged state, the latch is in the second latch position, the rotational member is in the second rotational member position, the end portion is separated from the recess, and the protrusion is wedged into the case,
    wherein the rotational member comprises a member abutting portion, the member abutting portion is located between the protrusion and the cover in a first direction, and when the member abutting portion is pushed, the rotational member is rotated from the first rotational member position to the second rotational member position, and the latch is thereby moved from the first latch position to the second latch position.

13. The housing structure as claimed in claim 12, wherein the locking module further comprises a first elastic element and a second elastic element, the first elastic element applies a first electric force to the rotational member, the rotational member tends to return to the first rotational member position due to the first electric force, the second elastic element applies a second electric force to the latch, and the latch tends to return to the second latch position due to the second elastic force.

14. The housing structure as claimed in claim 12, wherein the rotational member comprises a member body and a pivot portion, the end portion is located on the first end of the member body, the member abutting portion is located on the second end of the member body, and the pivot portion is connected to the member body and pivots on the base, wherein the case comprises a case wedging hole and a case abutting portion, in the wedged state, the latch is in the second latch position, the rotational member is in the second rotational member position, the end portion is separated from the recess, and the protrusion is wedged into the case wedging hole, the case abutting portion pushes the member abutting portion to rotate the rotational member from the first rotational member position to the second rotational member position, and to move the latch from the first latch position to the second latch position.

15. A locking module, comprising:
a base;
a latch, connected to the base, wherein the latch is moved between a first latch position and a second latch position relative to the base, and the latch comprises a recess and a protrusion; and
a rotational member, connected to the base, wherein the rotational member is moved between a first rotational member position and a second rotational member position relative to the base, the rotational member comprises an end portion, and the end portion is detachably connected to the recess,
wherein in a wedged state, the latch is in the second latch position, the rotational member is in the second rotational member position, the end portion is separated from the recess, and the protrusion is wedged into a case,
wherein the rotational member comprises a member abutting portion, the latch further comprises a latch body and an extending portion, the extending portion is connected to the latch body, the protrusion is formed on the extending portion, a latch opening is formed on the extending portion, and the member abutting portion passes through the latch opening, and when the rotational member is rotated from the first rotational member position to the second rotational member position, the latch is moved from the first latch position to the second latch position.

16. The locking module as claimed in claim 15, wherein the locking module further comprises a first elastic element and a second elastic element, the first elastic element applies a first elastic force to the rotational member, the rotational member tends to return to the first rotational member position due to the first electric force, the second elastic element applies a second electric force to the latch, and the latch tends to return to the second latch position due to the second elastic force.

17. The locking module as claimed in claim 15, wherein the latch body comprises a first body surface, the latch further comprises a pushing portion and a plurality of sliding ribs, the pushing portion is formed on the first body surface, and the sliding ribs are formed on the first body surface.

* * * * *